United States Patent [19]

Harland

[11] 4,045,783

[45] Aug. 30, 1977

[54] MOS ONE TRANSISTOR CELL RAM HAVING DIVIDED AND BALANCED BIT LINES, COUPLED BY REGENERATIVE FLIP-FLOP SENSE AMPLIFIERS, AND BALANCED ACCESS CIRCUITRY

[75] Inventor: Robert Francis Harland, Stittsville, Canada

[73] Assignee: Standard Microsystems Corporation, Hauppauge, N.Y.

[21] Appl. No.: 676,066

[22] Filed: Apr. 12, 1976

[51] Int. Cl.² ............................................. G11C 11/40
[52] U.S. Cl. ........................ 340/173 R; 340/173 CA; 340/173 FF; 307/238
[58] Field of Search ..... 340/173 R, 173 CA, 173 FF; 307/238, 279

[56] References Cited

U.S. PATENT DOCUMENTS

| 3,949,381 | 4/1976 | Dennard | 340/173 CA |
| 3,967,252 | 6/1976 | Donnelly | 340/173 FF |
| 4,003,035 | 1/1977 | Hoffmann | 340/173 CA |

*Primary Examiner*—Terrell W. Fears

*Attorney, Agent, or Firm*—Alfred A. DeLuca

[57] ABSTRACT

A dynamic MOS one transistor cell memory having a plurality of divided bit lines and a corresponding plurality of flip-flop sense amplifiers. Each bit line being divided into two electrically balanced parts which run adjacent and parallel to each other, and extend from the input/output nodes of their corresponding flip-flop sense amplifier to a balanced data access bus. The balanced data access bus being connected, in turn, to balanced data access, or read/write, circuitry. By virtue of the connection of balanced bit, and bus lines, and balanced data access circuitry, to each flip-flop sense amplifier, the probability of reading errors due to circuit imbalances at the input/output nodes of the flip-flops is greatly lessened. The direct connection, from the read/write circuitry to both parts of each bit line, arising from this arrangement obviates the need to enable a flip-flop sense amplifier in order to perform a writing operation, and permits a read-modify-write operation with flip-flop sense amplifiers designed with dynamic loads.

10 Claims, 2 Drawing Figures

MOS ONE TRANSISTOR CELL RAM HAVING DIVIDED AND BALANCED BIT LINES, COUPLED BY REGENERATIVE FLIP-FLOP SENSE AMPLIFIERS, AND BALANCED ACCESS CIRCUITRY

This invention relates to dynamic random access memories (RAMS), and more particularly to a MOS transistor memory having a single MOS transistor and a corresponding storage capacitor means at each storage location. Said transistor memory having a plurality of bit lines and a corresponding plurality of flip-flop sense amplifiers. Each bit line being preferably divided into two electrically equal parts. The two parts of any one bit line, being connected to complementary input/output nodes of the flip-flop sense amplifiers corresponding to said any one bit line. The two parts of any one bit line being substantially equal in length and extending, adjacent to each other, away from their corresponding flip-flop sense amplifier, to a balanced data access bus. Said bus being connected to complementary data terminals of a balanced data access circuit.

Various forms of single MOS transistor, or one transistor cell semi-conductor memories, are well known in the art. Generally, in these memories, storage elements are arranged in rows and columns as a matrix. In present practice in this field the line of storage elements associated with a particular bit line are said to be in a column, and the storage elements arranged in lines orthogonal to the bit lines are said to be in rows. Since the storage elements associated with a particular bit line are often drawn schematically in a horizontal line, this practice has the effect of using the work "column" to designate horizontal lines of storage elements and the word "row" to designate vertical lines of storage elements. As this specification has been drafted in accordance with this accepted practice, the word column line will be used to designate a line of storage elements running parallel to the bit lines, and the word row or word line will be used to designate a line of storage elements running at right angles to the bit lines.

Each storage element comprises a MOS transistor and a corresponding storage capacitor means. An electrically conductive path, generally referred to as a bit line, is provided for each column of storage elements. Each MOS transistor, of the storge elements associated with a particular bit line, being connected via its drain electrode to said particular bit line and via its source electrode to its corresponding storage capacitor means. The storage capacitor means may be a conventional integrated circuit capacitor structure or what is known as a MOS capacitor.

In this form of one transistor cell memory the presence or absence of a charge on any particular storage capacitor means is used to represent the usual binary states. By usual convention the presence of a charge in a storage capacitor is interpreted as a binary one, while the absence of a charge in said storage capacitor is interpreted as a binary zero. Any particular storage capacitor can be connected via its associated MOS transistor to its corresponding bit line by means of a signal from a word selection means or circuit, which is connected by a particular word selection line to the gate electrode of said associated MOS transistor. In smaller memories, the gate electrodes of all the storage elements in a particular row of storage elements are connected together in order that an entire group of storage elements can be connected to their respective bit lines by a single enable signal from the word selection circuit. In the silicon gate MOS integrated circuit form of construction commonly used in fabricating these one transistor cell memories, the bit line may be a diffused region in the semi-conductor substrate material and the word select line a strip of metal. Alternatively, the bit line may be a strip of metal, or a metal run, and the word select line formed by a polysilicon strip. To form a diffused bit line the diffused drain region of each MOS transistor is extended toward the diffused drain region of its adjacent MOS transistor until a single continuous strip of diffusion is formed. This construction has the advantage of not requiring the use of polysilicon, with its higher sheet resistivity, for the word line but the disadvantage of forming a bit line with a higher resistance and a more troublesome distributed capacitance with respect to the substrate material. Because the capacitance of a bit line, is several times larger than the capacitance of any one storage capacitor, the magnitude of the potential appearing on a bit line, as a result of the connection of a charged (binary 1 state) storage capacitor thereto, is significantly less than the potential across said any one storage capacitor prior to said connection. This reduction in magnitude is a result of the redistribution of the charge stored in the storage capacitor among the capacitance of the bit line, the capacitance of the storage capacitor in question and the capacitance of the access and read circuitry.

Among the various methods which have been used to effectively reduce the total capacitance and thereby reduce the likelihood of reading errors, U.S. Pat. No. 3,774,176 issued on Nov. 20, 1973, to Stein et al, has particular merit. In this patent each bit line is divided into two parts such that one half of the storage elements, of a corresponding column of storage elements, are connected to each part. A MOS transistor flip-flop sense amplifier, or regenerative flip-flop balanced sense amplifier, having complementary input/output nodes, is provided for each bit line. In each column of storage elements the two parts of the bit line are respectively connected to the two complementary input/output nodes of the flip-flop circuit corresponding to said bit line. By dividing a bit line into two more or less equal parts, the additional capacitance, which is placed in parallel with the capacitance of a storage element when said storage element is connected to said bit line, is reduced to approximately one half the total capacitance of said bit line. As a result of this reduction in capacitative loading, the potential appearing on a bit line, as a result of reading a binary 1 condition, attains a higher value than possible with a non-divided bit line. The flip-flop sense amplifier offers the additional advantages of providing an automatic means of writing the data read from a storage element back into said storage element, as well as means of providing a read out signal of improved waveform. In this circuit arrangement steps are taken to ensure that the design layout of each flip-flop sense amplifier is as symmetrical as possible and that the loading applied to the input/output nodes of each of said sense amplifiers by their corresponding divided bit lines is also as balanced as possible.

While variations of this circuit arrangement have been successfully used by many manufacturers to date, they nevertheless have several disadvantages. In normal operating practice, the storage capacitor of a storage element undergoing a reading operation is connected to its corresponding bit line and hence to one input/output node of a corresponding flip-flop sense amplifier before the flip-flop transistors of said sense amplifier are turned ON. Depending on the binary state of the storage element undergoing the reading operation, one input/output node of said slip-flop sense amplifier will, after appropriate clock signals have been applied to said sense amplifier, rise toward the supply potential, and the other will drop in potential. Since the load transistors of the flip-flop are designed with a higher ON resistance than the flip-flop inverter transistors, a speed/power tradeoff exists. If the load transistors are designed with high ON resistance so as to minimize undesired losses in the load transistor connected to the low input/output node of a flip-flop sense amplifier, then a longer time is required to raise the potential of the part of the bit line connected to the high input/output node of said flip-flop sense amplifier and thus rewrite a binary 1 level into a storage capacitor connected to said part of the bit line. For a given bit line capacitance, a reduction in cycle time can be bought only at the expense of increased power consumption.

While it is, in principle, relatively straight forward to design circuitry which can arrange to interrupt the flow of current, in the load transistor of a flip-flop sense amplifier which is connected to the lower potential input/output node, after the appropriate stable state of the flip-flop has been established, certain difficulties arise by the inroduction of such circuitry. An obvious difficulty arises in trying to fit a flip-flop sense amplifier, so modified, into the pitch, or inter-bit line spacing, of the bit lines. This arises from the need for additional chip area to accomodate the additional required circuitry.

Another and more serious difficulty is the loss of a read-modify-write capability. After a flip-flop sense amplifier has settled at a state representative of a storage element undergoing a reading operation, and the current in the load transistor connected to the lower potential input/output node of said sense amplifier has been interrupted, the read/write circuitry cannot change the binary state of said storage element without re-clocking said sense amplifier unless the storage element happens to be connected to the one part of the bit line directly connected to the read/write circuitry. This situation exists because it is usual practice to provide direct access to only one part of a bit line, and to rely on the centrally located flip-flop sense amplifier to transmit the appropriate binary signals to storage elements associated with the other, or far, part of said bit line.

If the loss in chip area can be tolerated, a read-modify-write capability can be achieved by providing direct access to both parts of a bit line. By directly accessing both parts of a bit line, the flip-flop sense amplifier corresponding to said bit line is not required for a writing operation and hence the interruption of current in one of its load transistors becomes a practical method of reducing current requirements. Providing access to both parts of a bit line becomes a difficult problem with conventional memory layouts where the flip-flop sense amplifiers are located in the middle of divided bit lines. Running bit decoder and bit access or data bus lines along the centre of an array is both difficult and undesirable as said lines would have to cross sensitive bit lines and also refrain from unbalancing the sensitive flip-flop sense amplifiers. The required access to both parts of a bit line can also be achieved by accessing the two ends of said bit line which are remote from their corresponding flip-flop sense amplifier, but this arrangement also has disadvantages in that the number of bit decoders must be doubled and the bit address lines have to be fed across the chip.

It has been found that a one transistor cell memory having a balanced flip-flop sense amplifier associated with each bit line can be constructed in a manner which provides direct access from the data access or read/write circuitry to both parts of said bit line without the necessity for running bit and decoder lines up the centre of the array or doubling the number of bit decoders and running address lines across the chip. Not only is the electrical balance of both parts of each bit line maintained, but an electrically balanced path is provided from each part of each bit line, via a balanced data access bus, to a balanced data access or read/write circuit. The capacitive loading of each part of any one bit line, including the effects of the balanced data access bus and balanced data access circuit, is seen at the input/output nodes of its corresponding flip-flop balanced sense amplifier, as being substantially equal during a reading operation. Such being the case, the likelihood of a flip-flop balanced sense amplifier incorrectly sensing the binary state of a storage element is greatly lessened even if the access transistors corresponding to the bit line parts connected to said sense amplifier are turned ON before said sense amplifier has reached its stable state. Since access is provided to both parts of each bit line, there is no need to enable the flip-flop balanced sense amplifiers during a writing operation, instead it is only necessary to access the appropriate part of a bit line and to arrange for connection of the storage capacitor of the selected storage element to the bit line in question.

To achieve a balanced sensing arrangement, along with a method of directly accessing both parts of each bit line in a manner economical of chip area, a novel and improved layout for each bit line has been found. Unlike the conventional layout, wherein both parts of each bit line extend away from their corresponding flip-flop sense amplifiers in opposite directions, according to this invention, both parts of each bit line extend away from their corresponding flip-flop sense amplifier input/output nodes in the same direction. Thus in comparison with more conventional arrangements, it can be said that each bit line has been folded at its corresponding flip-flop sense amplifier such that both parts of said bit line lie parallel and adjacent to each other. With this arrangement the ends, of each part of a bit line, remote from their corresponding flip-flop sense amplifier, are adjacent each other and thus readily connected in balanced fashion through MOS access transistors and via a balanced data access bus to a balanced data access circuit. The balanced data access bus might preferably run, parallel to the rows of storage elements, and near the ends of each bit line remote from the flip-flop sense amplifiers corresponding to each bit line. In response to a signal from a bit decoder means the MOS access transistors associated with any one bit line serve to connect both parts of said any one bit line to the balanced data access bus and hence to the balanced data access circuit. The bit decoder means being connected by a bit decoder line to the gate electrodes of said MOS access transistors.

Thus in accordance with the present invention there is provided a dynamic MOS memory having a plurality of storage elements arranged, as a matrix, in rows and columns, each of said storage elements comprising a MOS transistor connected in series with a storage capacitor means, said memory further comprising:

a. a balanced data access circuit for reading the binary status of, or writing a binary signal in, any selected storage element, said access circuit having first and second complementary data terminals;

b. a balanced data access bus, having first and second complementary data bus lines, the first and second complementary data bus lines being respectively connected to the first and second complementary data terminals of the balanced data access circuit;

c. a plurality of regenerative flip-flop balanced sense amplifiers, each of said sense amplifiers having first and second input/output nodes;

d. a plurality of bit lines, each bit line being divided into a first and a second part, the MOS transistors of the storage elements corresponding to any one bit line being connected in substantially equal number to the first and second parts of said any one bit line, the first and second parts of any one bit line, being respectively connected to the first and second input/output nodes of the regenerative flip-flop balanced sense amplifier corresponding to said any one bit line, and extending, adjacent each other, from said sense amplifier to the balanced data access bus for respective connection through a first and a second MOS access transistor to the first and second complementary data bus lines;

whereby, by turning ON the first and second MOS access transistors corresponding to a particular bit line, a substantially electrically balanced path is established from the first and second input/output nodes of the regenerative flip-flop balanced sense amplifier corresponding to said particular bit line to the first and second complementary data terminals of the balanced data access circuit.

An example embodiment of the invention will now be described with reference to the accompanying drawings in which.

Figure 1:
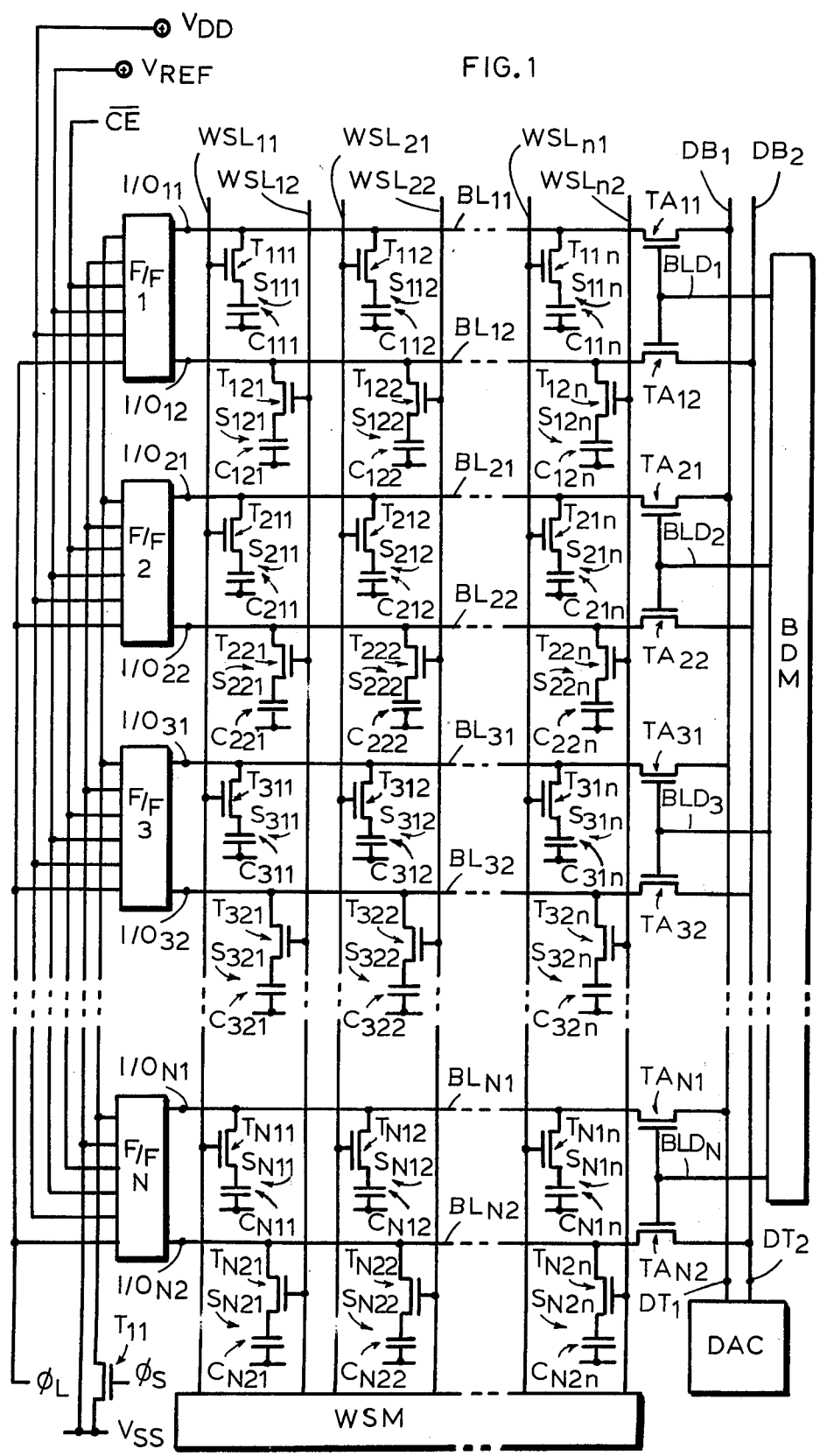
FIG. 1 is a block-schematic diagram of a random access memory of RAM.

With reference to FIG. 1, the dynamic MOS random access memory, or RAM, comprises a plurality of bit line parts denoted as $BL_{11}$ to $BL_{N2}$ where the first numerical subscript denotes the bit line number and the second numerical subscript denotes whether it is the first (1) or second (2) part of said bit line. Thus, for example, $BL_{12}$ identifies the second part of the first bit line.

A plurality of storage elements S are associated with each part of each bit line. Each storage elements S comprises a storage capacitor means C and a corresponding MOS transistor T linking said storage capacitor means C to its corresponding bit line part. The storage capacitor means may be either a conventional integrated circuit capacitor structure or may alternatively consist of an MOS capacitor having, as one electrode, an inversion layer contiguous with the drain region of its corresponding MOS transistor and as its other electrode a gate region. If the storage capacitor is of the MOS capacitor type, its gate electrode is connected to a positive supply potential (assuming N channel type MOS transistors). If, however, the storage capacitor is a conventional integrated circuit structure, one electrode of said capacitor is connected to its corresponding MOS transistor, and the other electrode is connected to a source supply potential $V_{SS}$. The source supply potential $V_{SS}$ is conventionally the memory circuit ground. For clarity and simplicity, the integrated circuit capacitor structure form of storage capacitor means has been selected for the drawings and related description. All the storage capacitors associated with the first part of the first bit line have the common designations $C_{11}$ followed by a numerical subscript from 1 to $n$. The storage capacitors associated with the second part of the first bit line bear the common designation $C_{12}$ followed by a numerical subscript from 1 to $n$. In a similar manner all MOS transistors forming part of the storage elements associated with the first part of the first bit line, have the common designation $T_{11}$ followed by a numerical subscript from 1 to $n$ and, for the second part of said bit line, the common designation $T_{12}$ followed by a numerical subscript from 1 to $n$. Each flip-flop sense amplifier is identified by the designation F/F followed by a numerical subscript which identifies the bit line with which said sense amplifier is associated. The drain supply, source supply and reference potentials are respectively designated by $V_{DD}$, $V_{SS}$ and $V_{REF}$ while the inverse chip enable clock, source clock and flip-flop sense amplifier load clock are respectively designated by $\overline{CE}$, $\phi_S$ and $\phi_L$.

In accordance with standard practice, the memory matrix is divided into columns and rows. The selection of any particular storage element S in this matrix is initiated by a signal from a word selection means WSM, which has a plurality of word selection lines WSL. Each word selection line WSL is connected to the gate electrodes of the MOS transistors of a group of storage elements S in a row of storage elements. The group of storage elements usually comprising all the storage elements in a row of storage elements, which are associated with either the first or second parts of the bit lines. The word selection line $WSL_{11}$, for example, is connected to the gate electrodes of transistors $T_{111}$, $T_{211}$, $T_{311}$, — to $T_{N11}$ and the word selection line $WSL_{12}$ is connected to the gate electrodes of transistors $T_{121}$, $T_{221}$, $T_{321}$, — to $T_{N21}$.

Data is read from and written into the memory by means of a data access circuit DAC, having first $DT_1$ and second $DT_2$ complementary data terminals which are respectively connected to first $DB_1$ and second $DB_2$ complementary data bus lines. The first $DB_1$ and second $DB_2$ complementary data bus lines are in turn respectively connected through the first $TA_{y1}$ and second $TA_{y2}$ MOS access transistors, to the first $BL_{y1}$ and second $BL_{y2}$ parts of each bit line, where y denotes the bit line number which ranges from 1 to N. With reference to the first bit line where y equals 1, for example, the first $BL_{11}$ and second $BL_{12}$ parts of said bit line are respectively connected through the first $TA_{11}$ and second $TA_{12}$ access transistors to the first $DB_1$ and second $DB_2$ complementary data bus lines and thereafter to the first $DT_1$ and second $DT_2$ complementary data terminals of the data access circuit DAC.

The first, $TA_{y1}$ and second $TA_{y2}$ MOS access transistors of each bit line are turned ON or OFF as required by a signal from the bit decoder means BDM. The gate electrodes of the first $TA_{y1}$ and second $TA_{y2}$ MOS access transistors associated with each bit line are interconnected and further connected via a bit decoder line $BLD_y$ to the bit decoder means BDM. Thus, for example, with reference to the second bit line, the gate electrodes of the first $TA_{21}$ and second $TA_{22}$ MOS access transistors are interconnected and further connected via the second bit decoder line BLD$_2$ to the bit decoder means BDM.

As a more detailed operation will later be described with reference to FIG. 2 of the drawings, the operation of the random access memory illustrated in FIG. 1 will only be generally described. Assume, for example, that it is desired to read out the contents of the storage elements in the second row of storage elements which are associated with the second part of each bit line. In a manner, which will subsequently be described in greater detail, an enable signal is generated by the word selection means WSM and applied to word select line WSL$_{22}$. This enable signal turns ON transistors T$_{122}$, T$_{222}$, T$_{322}$ to T$_{N22}$ such that the storage capacitors C$_{122}$, C$_{222}$, C$_{322}$, — to C$_{N22}$ are respectively connected to the second parts BL$_{12}$, BL$_{22}$, BL$_{32}$, — to BL$_{N2}$ of their corresponding bit lines.

Depending on the binary state stored in a particular storage element S$_{y22}$, where $y$ denotes a bit line number which ranges from 1 to N, a charge redistribution occurs between the storage capacitor C$_{y22}$ of said storage element S$_{y22}$ and the second part BL$_{y2}$ of its corresponding bit line to raise or lower the potential of said bit line.

After the storage capacitors, corresponding to each storage element C$_{122}$, C$_{222}$, to C$_{322}$ — to C$_{N22}$ have been connected to their respective bit lines, the flip-flop sense amplifiers are enabled by signals from the source clock $\phi_S$ and the load clock $\phi_L$. Because the second input/output nodes I/O$_{y2}$ of the flip-flop sense amplifiers F/F$_y$ are connected to their respective second bit line parts BL$_{y2}$, the flip-flop sense amplifiers F/F$_y$ are switched into correspondence with, and reinforce the complementary binary signals present on said bit line parts. Furthermore, because the MOS transistors T$_{y22}$ of the selected group of storage elements S$_{y22}$ in the second row of storage elements are conducting as the flip-flop sense amplifiers are enabled, the binary states of said storage elements are restored thereby resulting in an effectively non-destructive read-out operation. By virtue of the connection of the second part of each bit line BL$_{12}$, BL$_{22}$, to BL$_{N2}$ through access transistors TA$_{12}$, TA$_{22}$, — to TA$_{N2}$ respectively and along the second data bus line DB$_2$ to the data access circuit, the status of the selected group of storage elements can be read and transmitted to external circuitry.

Conversely a writing operation can be performed on the selected group of storage elements by generating complementary binary signals at the second data terminal DT$_2$ of the data access circuit DAC, and transmitting said binary signals to the second part of each bit line BL$_{y2}$. Unlike the reading operation, it is not necessary to enable the flip-flop sense amplifiers to perform a writing operation. Consider a writing operation for the aforementioned selected group of storage elements. Once an access transistor TA$_{y2}$ associated with the second part BL$_{y2}$ of a bit line has been turned ON, and the MOS transistor T$_{y22}$ of a storage element S$_{y22}$ has been turned ON to connect its storage capacitors C$_{y22}$ to said bit line, a signal generated by the data access circuit DAC can readily be written or stored in said storage element S$_{y22}$.

The structural makeup and the operation of a preferred embodiment of the invention will now be described with reference to FIG. 2 of the drawings. For convenient comparison with FIG. 1 of the drawings, FIG. 2 will be schematically representative of the first flip-flop sense amplifier and first bit line and hence will be labelled accordingly.

Figure 2:
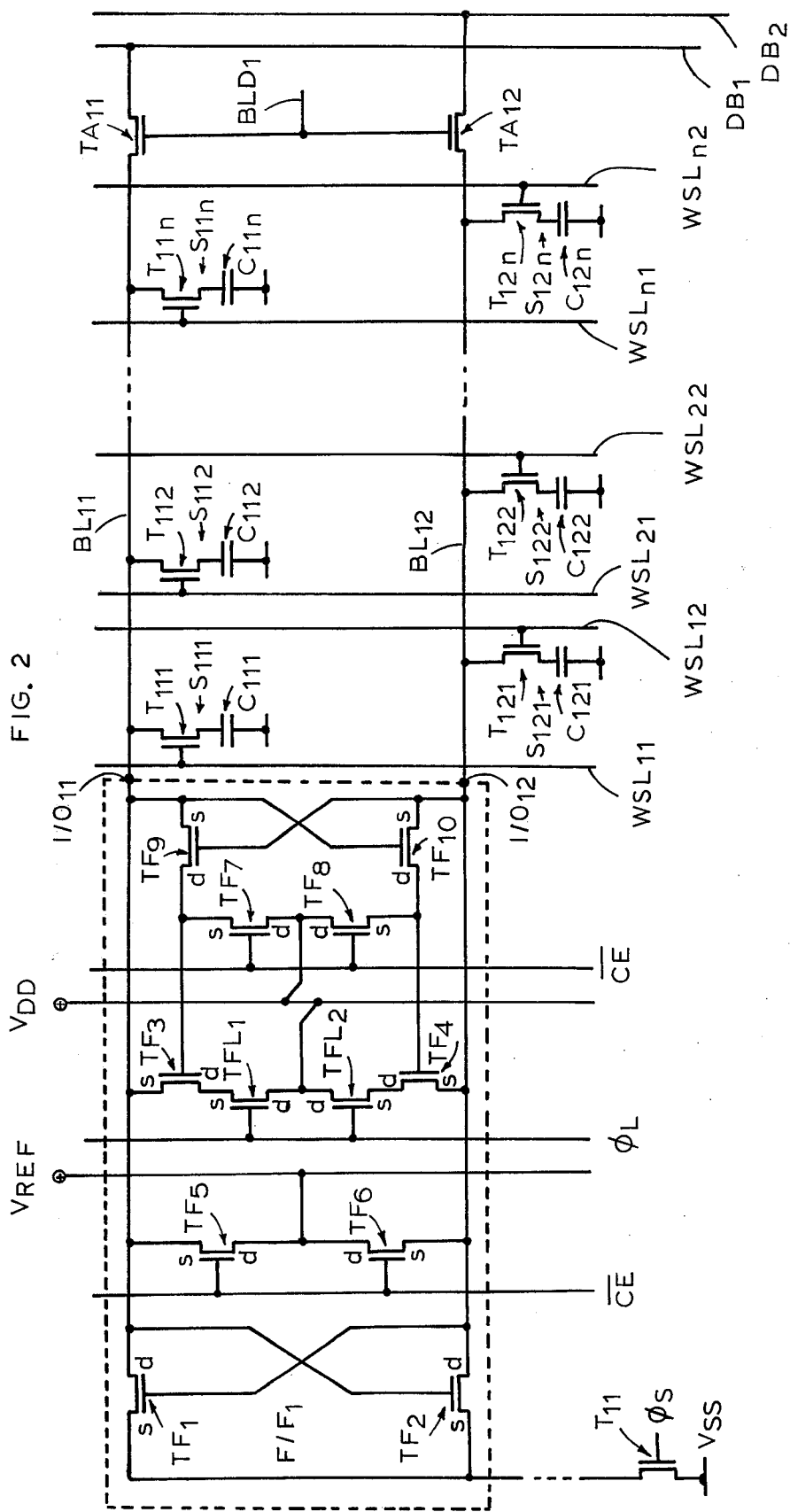
FIG. 2 is a schematic diagram of a typical bit line and corresponding flip-flop sense amplifier for a random access memory constructed in accordance to the teaching of FIG. 1.

In FIG. 2 of the drawings, MOS transistors TF$_1$ and TF$_2$ are cross coupled in the usual manner to form a flip-flop F/F$_1$ having first I/O$_{11}$ and second I/O$_{12}$ input/output nodes. The first I/O$_{11}$ and second I/O$_{12}$ input/output nodes are respectively connected to the first BL$_{11}$ and second BL$_{12}$ parts of the first bit line.

The source electrodes of the first TF$_1$ and second TF$_2$ MOS transistors are interconnected then further connected through an eleventh MOS transistor T$_{11}$ to the source supply potential V$_{SS}$. The eleventh MOS transistor T$_{11}$ may service one or any number of flip-flop sense amplifiers depending on design preference. A fifth MOS transistor TF$_5$ serves to connect a source of reference potential V$_{REF}$ to the first part of the first bit line BL$_{11}$ while a sixth MOS transistor TF$_6$ serves to connect said source V$_{REF}$ to the second part of the first bit line BL$_{12}$ during the time the memory is quiescent. The gate electrodes of the fifth TF$_5$ and sixth TF$_6$ MOS transistors being interconnected and arranged for connection to an inverse chip enable clock $\overline{CE}$. The first and second MOS load transistors TFL$_1$ and TFL$_2$, in conjunction with MOS transistors TF$_3$, TF$_4$, TF$_7$, TF$_8$, TF$_9$, and TF$_{10}$ form an optional dynamic load arrangement for MOS transistors TF$_1$ and TF$_2$ of the first flip-flop sense amplifier F/F$_1$.

If the current saving feature of a dynamic load is not desired, the flip-flop loads can be simplified to two transistors, namely the first and second MOS load transistors TFL$_1$, TFL$_2$. Such being the case, the first and second MOS load transistors TFL$_1$, TFL$_2$ would respectively connect the source of drain supply potential V$_{DD}$ to the first BL$_{11}$ and second BL$_{12}$ parts of the first bit line. The gate electrodes of the first TFL$_1$ and second TFL$_2$ MOS load transistors being connected to the sense amplifier load clock $\phi_L$.

Turning to the dynamic load arrangement, it can be seen that a third MOS transistor TF$_3$ is connected in series with the source electrode of the first MOS load transistor TFL$_1$ and the first part of the first bit line BL$_{11}$, while a fourth MOS transistor TF$_4$ is connected in series with the source electrode of the second MOS load transistor TFL$_2$ and the second part of the first bit line BL$_{12}$. A seventh TF$_7$ and an eighth TF$_8$ MOS transistor, are connected to the drain supply potential V$_{DD}$ and respectively connected to the gate electrodes of the third TF$_3$ and fourth TF$_4$ MOS transistors. The gate electrodes of the seventh TF$_7$ and eighth TF$_8$ MOS transistors being interconnected and arranged for connection to an inverse chip enable source $\overline{CE}$. The gate electrodes of the third TF$_3$ and fourth TF$_4$ MOS transistors are respectively connected through ninth TF$_3$ and fourth TF$_4$ MOS transistors are respectively connected through ninth TF$_9$ and tenth TF$_{10}$ MOS transistors to the first I/O$_{11}$ and second I/O$_{12}$ input/output nodes. The gate electrodes of the ninth TF$_9$ and tenth TF$_{10}$ MOS transistors being respectively connected to the second BL$_{12}$ and first parts BL$_{11}$ of the first bit line.

Although a relatively large number of storage elements are normally connected to each part of the first bit line, for simplicity, only three storage elements are shown on each part of the first bit line in FIG. 2. For the first part of the first bit line BL$_{11}$ only the first S$_{111}$, second S$_{112}$ and nth S$_{11n}$ storage elements are shown, similarly for the second part of the first bit line BL$_{12}$, the first S$_{121}$, second S$_{122}$ and nth S$_{12n}$ storage elements are shown.

Each storage element comprises a capacitor and a MOS transistor linking one electrode of said capacitor to one part of the bit line. The other electrode of said capacitor is connected to the source supply potential $V_{SS}$. Alternatively if the MOS type capacitor structure is used for the storage capacitance means, the drain supply potential $V_{DD}$ is generally used in place of the source supply potential $V_{SS}$. Accordingly, for the first storage element $S_{111}$ by way of example, MOS transistor $T_{111}$ links storage capacitor $C_{111}$, to the first part of the first bit line $BL_{11}$.

The gate electrodes of the MOS transistors $T_{111}$, $T_{112}$, to $T_{11n}$ and $T_{121}$, $T_{122}$ to $T_{12n}$ associated with both parts of the first bit line are respectively connected via corresponding word selection lines $WSL_{11}$, $WSL_{21}$, to $WSL_{n1}$ and $WSL_{12}$, $WSL_{22}$ — to $WSL_{n2}$ to the word selection means WSM.

Access, to the data access circuit DAC, from the first part of the first bit line $BL_{11}$, is provided through the first MOS access transistor $TA_{11}$ which connects the first part of the first bit line $BL_{11}$ to the first data bus line $DB_1$. The gate electrode of the first MOS access transistor $TA_{11}$ is connected via a first bit decoder line $BLD_1$ to the bit decoder means BDM.

While the schematic drawings in FIGS. 1 and 2 suggest a folded bit line structure with a flip-flop sense amplifier, and associated load transistors, at one end of the two parts of each bit line, and a pair of MOS access transistors at the other end of said two parts of each bit line, certain variations may be made in the layout of a practical memory which are in keeping with the spirit and scope of the present invention.

One layout variation, which may be practised, is the location of the flip-flop dynamic load circuitry nearer the first and second access transistors than to the cross coupled flip-flop sense amplifier MOS transistors. With reference to the first bit line, for example, the MOS load transistors $TFL_1$, $TFL_2$ and associated MOS transistors $TF_3$, $TF_4$, $TF_7$, $TF_8$, $TF_9$ and $TF_{10}$ could therefore be located on the chip in an area near the first and second MOS access transistors $TA_{11}$, $TA_{12}$. Such being the case, said load and associated MOS transistors would be separated from the first flip-flop sense amplifier MOS transistors $TF_1$, $TF_2$ by approximately the length of one bit line part.

The first and second parts of each bit line will generally run parallel to each other and extend from the two input/output terminals of their corresponding flip-flop sense amplifiers to the data bus, such that the flip-flop sense amplifiers will form a line at one side of the matrix of storage elements and the data bus will extend in a parallel direction along the other side of said matrix of storage elements. This physical layout permits the fabrication of a memory in which the input/output nodes of each flip-flop sense amplifier experience electrically balanced loading by the bit line parts and data access circuitry; while at the same time permitting easy access to both parts of each bit line. The first and second parts of each bit line will generally be of approximately equal length and formed by metal runs.

To ensure the electrical balance of both parts of each bit line, each word select line is extended as required to ensure that each word select line crosses both parts of every bit line. With respect to the first bit line, it can be seen in FIGS. 1 and 2 that each word select line crosses both parts $BL_{11}$ and $BL_{12}$ of the first bit line.

The first and second MOS access transistors of each bit line are fabricated with matched electrical parameters such that their inherent gate to channel capacitances are substantially equal.

With respect to the first bit line, for example, the application of a turn ON signal, to the gate electrodes of the first $TA_{11}$ and second $TA_{12}$ MOS access transistors, by the bit decoder means BDM has the effect of ensuring that unwanted couplings of the turn ON signal via the gate to channel capacitances to the first $BL_{11}$ and second $BL_{12}$ parts of the bit line are substantially balanced. This arrangement provides a safeguard against imbalancing the first $BL_{11}$ and second $BL_{12}$ parts of the bit line by said turn ON signal in a manner which might lead the first flip-slop sense amplifier $F/F_1$ to settle at an incorrect state during a reading operation.

Such incorrect sensing might otherwise be particularly likely to occur if turn ON signals on the bit decoder lines closely follow the source clock $\phi_S$, as is practised in memories designed for fast access.

The operation of the RAM will not be described with reference to FIG. 2 of the drawings.

During the quiescent period of the memory the inverse chip enable $\overline{CE}$ clock signal is held at a positive potential in order to keep the fifth, sixth, seventh and eighth MOS transistors turned ON or conducting. Since the fifth and sixth MOS transistors are conducting the reference potential $V_{REF}$ is applied to both the first $I/O_{11}$ and second $I/O_{12}$ input/output nodes of the flip-flop, thereby establishing a common potential at both input/output nodes of the first flip-flop $F/F_1$. The potential of the inverse chip enable $\overline{CE}$ clock signal, being more positive than the reference potential $V_{REF}$ during this quiescent period, ensures that a low impedance connection is established from the reference potential source to both input/output nodes of the first flip-flop $F/F_1$. Typical values for $\overline{CE}$ and $V_{REF}$ are +12 and +6 volts respectively.

During this quiescent period a signal from the inverse chip enable clock $\overline{CE}$ also serves to turn ON the seventh $TF_7$ and eighth $TF_8$ MOS transistors so that the drain supply potential $V_{DD}$ can be applied to the gate electrodes of the third $TF_3$ and fourth $TF_4$ MOS transistors.

The gate electrodes of the third $TF_3$ and fourth $TF_4$ MOS transistors being positive with respect to their source electrodes, which are connected to the first and second input/output nodes, serve to turn ON said third and fourth MOS transistors. Typically the drain supply potential $V_{DD}$ is about +12 volts, whereas the reference potential $V_{REF}$ is about +6 volts.

Assume now that it is desired to read the binary state of the second storage element $S_{112}$ which is connected to the first part of the first bit line $BL_{11}$. In preparation for the intended reading operation the potential of the inverse chip enable clock signal $\overline{CE}$ drops to a level which is insufficient to maintain the fifth $TF_5$, sixth $TF_6$, seventh $TF_7$ and eighth $TF_8$ transistors in their on state. Accordingly, the first $I/O_{11}$ and second $I/O_{12}$ input/output nodes are allowed to float at a common mode potential derived from 8 transistors in their ON state. reference potential $V_{REF}$. After the seventh $TF_7$ and eighth $TF_8$ MOS transistors have been turned OFF, charges remain on the gate electrodes of the third $TF_3$ and fourth $TF_4$ MOS transistors, as a result of the gate to source capacitances of said third and fourth MOS transistors. which permit the third $TF_3$ and fourth $TF_4$ MOS transistors to remain in their ON state.

To read the binary state of the selected storage element $S_{112}$, a signal is transmitted from the word select means WSM via word select line $WSL_{21}$ to the gate electrode of transistor $T_{112}$. This signal turns ON transistor $T_{112}$ and thereby connects storage capacitor $C_{112}$ to the first part $BL_{11}$ of the first bit line. Assume furthermore, that the storage capacitor $C_{112}$ is charged such that the selected storage elements $S_{112}$ is interpreted as being in its binary 1 state.

After a charge redistribution has occurred between storage capacitor $C_{112}$ and the first part of the first bit line $BL_{11}$, the potential of the first input/output node $I/O_{11}$ rises above the common mode potential such that the second flip-flop inverter transistor $TF_2$ begins to turn ON.

To complete the turning ON of the second MOS inverter transistor $TF_2$, a signal from the source clock $\phi_S$ turns ON an eleventh MOS transistor $T_{11}$ which pulls the sources of the first $TF_1$ and second $TF_2$ MOS transistors down to the source supply potential $V_{SS}$. Concurrent with the signal from the source clock $\phi_S$, or slightly later, a signal is generated by the load clock $\phi_L$ which serves to turn ON the first $TFL_1$ and second $TFL_2$ flip-flop transistors. Once the load transistors $TFL_1$, $TFL_2$ have been turned ON, a current path is established from the drain supply, through the first load transistor $TFL_1$ and the third MOS transistor $TF_3$, to the first part of the first bit line $BL_{11}$. This current path to the first bit line $BL_{11}$ serves to raise the potential of the first part $BL_{11}$ of the first bit line and thereby increase the charge in the storage capacitor $C_{112}$ which is connected to the first bit line via MOS transistor $T_{112}$. Since the second MOS load transistor $TFL_2$ and the fourth $TF_4$, second $TF_2$, and eleventh $T_{11}$ MOS transistors are all turned ON during this interval, current flows through said MOS transistors from the drain supply to the source supply thereby wasting power in the second load transistor $TFL_2$. The load transistors $TFL_1$ and $TFL_2$, by design, have higher source to drain resistance in their ON state than the first $TF_1$ and second $TF_2$ MOS transistors associated with the first flip-flop $F/F_1$.

After the potential of the first part of the first bit line $BL_{11}$ has risen, relative to the potential of the second part $BL_{12}$ of the first bit line, by an amount sufficient to turn ON the tenth MOS transistor $TF_{10}$, a path is established, from the gate electrode of the fourth MOS transistor $TF_4$ to the second part of the first bit line $BL_{12}$. This path, through the tenth MOS transistor, serves to drain away the charge on the gate electrode of the fourth $TF_4$ MOS transistor and thereby turn OFF the fourth $TF_4$ MOS transistor. Since the fourth $TF_4$ MOS tranistor is in series with the second MOS load transistor $TFL_2$, this action has the effect of interrupting the load current in the second load transistor $TFL_2$.

By interrupting the load current in the second MOS load transistor $TFL_2$, the undersired power loss in said load transistor, is prevented except during the short period of time immediately prior to the turning OFF of the fourth MOS transistor $TF_4$.

What is claimed is:

1. A dynamic MOS memory having a plurality of storage elements arranged, as a matrix, in rows and columns, each of said storage elements comprising a MOS transistor connected in series with a storage capacitor means said memory further comprising:
   a. a balanced data access circuit for reading the binary status of, or writing a binary signal in, any selected storage element, said access circuit having first and second complementary data terminals;
   b. a balanced data access bus, having first and second complementary data bus lines, the first and second complementary data bus lines being respectively connected to the first and second complementary data terminals of the balanced data access circuit;
   c. a plurality of regenerative flip-flop balanced sense amplifiers, each of said sense amplifiers having first and second input/output nodes;
   d. a plurality of bit lines, each bit line being divided into a first and a second part, the MOS transistors of the storage elements corresponding to any one bit line being connected in substantially equal number to the first and second parts of said any one bit line, the first and second parts of any one bit line, being respectively connected to the first and second input/output nodes of the regenerative flip-flop balanced sense amplifier corresponding to said any one bit line, and extending, adjacent each other, from said sense amplifier to the balanced data access bus for respective connection through a first and a second MOS access transistor to the first and second complementary data bus lines;
   whereby, by turning ON the first and second MOS access transistors corresponding to a particular bit line, a substantially electrically balanced path is established from the first and second input/output nodes of the regenerative flip-flop balanced sense amplifier corresponding to said particular bit line to the first and second complementary data terminals of the balanced data access circuit.

2. The dynamic MOS memory as defined in claim 1 further comprising a word selection means having a plurality of word selection lines, any one word selection line being connected to the gate electrodes of the MOS transistors of a group of storage elements in a particular row of storage elements associated with a particular word;
   whereby the storage capacitor means of the storage elements associated with said particular word are connected to, or disconnected from, their corresponding bit lines by turning ON or OFF said MOS transistors under control of said word selection means.

3. The dynamic MOS memory as defined in claim 2 further comprising a bit decoder means having a plurality of bit decoder lines, any one bit decoder line corresponding to a particular bit line and being connected to the gate electrodes of the first and second MOS access transistors respectively linking the first and second parts of said particular bit line to the first and second complementary bus lines;
   whereby during a reading operation, complementary binary signals, present on the first and second parts of said particular bit line, are applied to the first and second complementary data terminals of the balanced data access circuit by turning ON said first and second MOS access transistors and whereby, during a writing operation, complementary binary signals generated by said access circuit are carried by said bus lines and the first and second parts of said bit line to the storage capacitor means of the storage element selected for the writing operation.

4. A dynamic MOS memory having a plurality of storage elements arranged, as a matrix, in rows and columns, each of said storage elements comprising a MOS transistor connected in series with a storage capacitor means, said memory further comprising:

a. a word selection means having a plurality of word selection lines, any one word selection line being connected to the gate electrodes of the MOS transistors of a group of storage elements in a particular row of storage elements associated with a particular word;

b. a balanced data access circuit for reading the binary status of, or writing a binary signal in, any selected storage element, said access circuit having first and second complementary data terminals;

c. a balanced data access bus, having first and second complementary data bus lines, the first and second complementary data bus lines being respectively connected to the first and second complementary data terminals of the balanced data access circuit;

d. a plurality of regenerative flip-flop balanced sense amplifiers; each of said sense amplifiers having first and second input/output nodes and first and second MOS transistors, the gate electrodes of the first and second MOS transistors being respectively connected to the second and first input/output nodes, one electrode of the source and drain electrodes of the first MOS transistor being connected to a corresponding one electrode of the source and drain electrodes of the second MOS transistor, the other electrode of the source and drain electrodes of the first MOS transistor being connected to the first input/output node while the other electrode of the source and drain electrodes of the second MOS transistor being connected to the second input/output node;

e. a plurality of bit lines, each bit line being divided into a first and second part, the MOS transistors of the storage elements corresponding to any one bit line being connected in substantially equal number to the first and second parts of said any one bit line, the first and second parts of said any one bit line being respectively connected to the first and second input/output nodes of the regenerative flip-flop balanced sense amplifier corresponding to said any one bit line, and extending, adjacent each other, from said sense amplifier to the balanced data access bus for respective connection through a first and a second MOS access transistor to the first and second complementary data bus lines;

f. bit decoder means having a plurality of bit decoder lines, any one bit decoder line corresponding to a particular bit line and being connected to the gate electrodes of the first and second MOS access transistors respectively linking the first and second parts of said particular bit line to the first and second complementary bus lines;

whereby, during a writing operation, the first and second MOS access transistors of a selected bit line are turned ON by a signal from the bit decoder means, such that complementary binary signals generated by said access circuit are transmitted via said data bus lines through said MOS access transistors to the first and second parts of said selected bit line and thereafter to the storage capacitor means of the storage element connected to one part of said selected bit line by a signal from the word selection means;

and whereby, during a reading operation, complementary binary signals are generated at the first and second input/output nodes of the regenerative flip-flop sense amplifier corresponding to a selected bit line, in response to the binary state of a storage element connected to said selected bit line, said complementary binary signals being transmitted by the balanced data access bus to the balanced data access circuit by turning ON the first and second MOS access transistors corresponding to said selected bit line.

5. The dynamic MOS memory as defined in claim 1 wherein the regenerative flip-flop balanced sense amplifiers are characterized by dynamic load circuitry, each flip-flop balanced sense amplifier having first and second MOS load transistors arranged for connection to a supply potential, said first and second MOS load transistors being respectively connected through third and fourth MOS transistors to the first and second input/output nodes of said sense amplifier, the conduction of said third and fourth MOS transistors being controlled by means responsive to the relative potentials of the first and second parts of the corresponding divided bit line so as to interrupt the flow of current in the MOS load transistor connected to the input/output node of said sense amplifier having the lower relative potential.

6. The dynamic MOS memory as defined in claim 4 wherein the regenerative flip-flop balanced sense amplifiers are characterized by dynamic load circuitry, each flip-flop balanced sense amplifier having first and second MOS load transistors arranged for connection to a supply potential, said first and second MOS load transistors being respectively connected through third and fourth MOS transistors to the first and second input/output nodes of said sense amplifier, the conduction of said third and fourth MOS transistors being controlled by means responsive to the relative potentials of the first and second parts of the corresponding divided bit line so as to interrupt the flow of current in the MOS load transistor connected to the input/output node of said sense amplifier having the lower relative potential.

7. The dynamic MOS memory as defined in claim 4 wherein each word selection line crosses the first and second parts of each bit line; whereby electrical signals on any word selection line affect the first and second parts of each bit line in a balanced manner.

8. The dynamic MOS memory as defined in claim 4 wherein the first and second MOS access transistors corresponding to any one bit line have matched electrical parameters; whereby, upon application of a signal to the gate electrodes of said first and second MOS access transistors by the bit decoder means, electrically balanced signals are coupled to the first and second parts of said bit line by feed-through from the gate electrodes of said first and second MOS access transistors to the first and second parts of said bit line.

9. The dynamic MOS memory as defined in claim 4 wherein the data bus lines and the bit lines are formed of metal, and wherein the word selection lines are formed of polysilicon material.

10. The dynamic MOS memory as defined in claim 6 wherein the means responsive to the relative potentials of the first and second parts of said bit line comprises, ninth, seventh, eighth and tenth MOS transistors associated with each particular bit line and sequentially connected to form a series circuit from the first to the second parts of said particular bit line; the junction of the ninth and seventh MOS transistors being connected to the gate electrode of the third MOS transistor, the junction of the seventh and eighth MOS transistors being arranged for connection to a supply potential, and the junction of the eighth and tenth MOS transistors being connected to the gate electrode of the fourth MOS transistor; the gate electrodes of the seventh and eighth MOS transistors being interconnected and arranged for connection to an enable signal; and the gate electrodes of the ninth and tenth MOS transistors being respectively connected to the second and first parts of said particular bit line.

* * * * *